(12) United States Patent
Khusnatdinov et al.

(10) Patent No.: US 10,663,869 B2
(45) Date of Patent: May 26, 2020

(54) IMPRINT SYSTEM AND IMPRINTING PROCESS WITH SPATIALLY NON-UNIFORM ILLUMINATION

(71) Applicant: CANON KABUSHIKI KAISHA, Tokyo (JP)

(72) Inventors: Niyaz Khusnatdinov, Round Rock, TX (US); Edward Brian Fletcher, Austin, TX (US); Craig William Cone, Austin, TX (US); Douglas J. Resnick, Leander, TX (US); Zhengmao Ye, Austin, TX (US)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 15/837,898

(22) Filed: Dec. 11, 2017

(65) Prior Publication Data

US 2019/0179228 A1 Jun. 13, 2019

(51) Int. Cl.
*G03B 27/04* (2006.01)
*G03F 7/20* (2006.01)
*G03F 7/00* (2006.01)

(52) U.S. Cl.
CPC .......... *G03F 7/7035* (2013.01); *G03F 7/0002* (2013.01); *G03F 7/7055* (2013.01); *G03F 7/70116* (2013.01); *G03F 7/70558* (2013.01)

(58) Field of Classification Search
CPC .. G03F 7/7055; G03F 7/70558; G03F 7/7035; G03F 7/70375; G03F 7/703; G03F 7/70091; G03F 7/70125; G03F 7/70191; G03F 7/70116; G03F 7/0002; B29C 59/02; B82Y 40/00

USPC .. 355/52, 53, 55, 67–71, 77, 78, 80, 83, 95, 355/122, 124–127, 132; 250/492.1, 250/492.2, 492.22; 430/5, 394; 425/174.4

See application file for complete search history.

(56) References Cited

U.S. PATENT DOCUMENTS

| | | |
|---|---|---|
| 6,936,194 B2 | 8/2005 | Watts |
| 7,157,036 B2 | 1/2007 | Choi et al. |
| 8,066,930 B2 | 11/2011 | Sreenivasan et al. |
| 8,076,386 B2 | 12/2011 | Xu et al. |

(Continued)

FOREIGN PATENT DOCUMENTS

| | | |
|---|---|---|
| JP | 2003-249444 A | 9/2003 |
| JP | 2011-521438 A | 7/2011 |

(Continued)

*Primary Examiner* — Christina A Riddle
(74) *Attorney, Agent, or Firm* — Daniel Ratoff

(57) ABSTRACT

An imprinting system and method. An illumination system for imprinting, during a first period of time, that illuminates a first portion of boundary region that surrounds a pattern region with a thickening dosage of light that is within a first dose range, such that the fluid in the first portion of the boundary region does not solidify but does increase a viscosity of the fluid. The illumination system, during a second period of time, illuminates the pattern region with a curing dosage of light that is within a second dose range higher than the first dose range. Prior to illumination, the imprinting includes dispensing droplets and holding a template with a template chuck such that the template contact the droplets and the droplets merge and form a fluid front that spreads through the pattern region and towards the boundary region.

23 Claims, 8 Drawing Sheets

(56) References Cited

U.S. PATENT DOCUMENTS

| | | | |
|---|---|---|---|
| 8,349,241 B2 | 1/2013 | Sreenivasan et al. | |
| 8,361,371 B2 | 1/2013 | Khusnatdinov et al. | |
| 8,609,326 B2 | 12/2013 | Sreenivasan et al. | |
| 8,641,958 B2 | 2/2014 | Khusnatdinov et al. | |
| 8,946,093 B2 | 2/2015 | Mikami | |
| 10,101,663 B2 | 10/2018 | Wakabayashi et al. | |
| 2003/0138704 A1 | 7/2003 | Mei et al. | |
| 2005/0212156 A1* | 9/2005 | Tokita | B29C 43/003 264/1.36 |
| 2008/0303187 A1* | 12/2008 | Stacey | B29C 43/003 264/293 |
| 2009/0200710 A1* | 8/2009 | Khusnatdinov | B82Y 10/00 264/496 |
| 2009/0224436 A1* | 9/2009 | Mikami | B82Y 10/00 264/447 |
| 2011/0273684 A1* | 11/2011 | Owa | B29C 43/003 355/53 |
| 2013/0078820 A1* | 3/2013 | Mikami | G03F 7/0002 438/778 |
| 2013/0078821 A1 | 3/2013 | Furutono | |
| 2014/0027955 A1* | 1/2014 | Wakabayashi | G03F 7/70 264/447 |
| 2014/0272174 A1 | 9/2014 | Furutono | |
| 2014/0340660 A1 | 11/2014 | Suzuki et al. | |
| 2015/0118847 A1 | 1/2015 | Mikami | |
| 2016/0136872 A1 | 5/2016 | Yanagisawa | |
| 2018/0210352 A1* | 7/2018 | Jung | G03F 7/0002 |
| 2020/0073232 A1* | 3/2020 | Tavakkoli Kermani Ghariehali | G03F 7/0002 |

FOREIGN PATENT DOCUMENTS

| | | |
|---|---|---|
| JP | 2011-181548 A | 9/2011 |
| JP | 2013-069918 A | 4/2013 |
| JP | 2013-069919 A | 4/2013 |
| JP | 2013-110196 A | 6/2013 |
| JP | 2014-027016 A | 2/2014 |
| JP | 2014-120604 A | 6/2014 |
| JP | 2014-179527 A | 9/2014 |
| JP | 2014-188869 A | 10/2014 |
| JP | 2014-229670 A | 12/2014 |
| JP | 2015-106670 A | 6/2015 |
| JP | 2016058735 A | 4/2016 |
| JP | 2016-096269 A | 5/2016 |
| JP | 2017-147283 A | 8/2017 |
| WO | WO/2019/065250 | 4/2019 |
| WO | WO/2019/078060 | 4/2019 |

* cited by examiner

IMPRINT SYSTEM AND IMPRINTING PROCESS WITH SPATIALLY NON-UNIFORM ILLUMINATION

BACKGROUND

Field of Art

The present disclosure relates to systems, software, and methods for nanoimprint with non-uniform illumination.

Description of the Related Art

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate such as a semiconductor wafer. Nano-fabrication provides greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. No. 8,349,241, U.S. Pat. No. 8,066,930, and U.S. Pat. No. 6,936,194, all of which are hereby incorporated by reference herein.

U.S. Pat. No. 8,361,371 discloses an imprint process that includes exposing using a mask to solidify a band around an imprint area by exposing only the area around the imprint area to energy; then removing the mask and exposing the imprint area so that whole area is imprinted. U.S. Pat. No. 8,609,326 discloses solidifying an outer portion of polymeric material in response to energy prior to an inner portion being exposed to energy. This was done to avoid misalignment due to heating of the substrate when the inner portion is exposed to energy.

SUMMARY

At least a first embodiment, may be an imprinting system. The imprinting system may include a formable material dispensing system configured to dispense a fluid as a plurality of droplets onto a substrate. The imprinting system may include a template chuck configured to hold a template with a boundary region that surrounds and does not overlap a pattern region. The template chuck may be configured to position the template such that the template contacts the plurality of droplets such that the plurality of droplets merge and form a fluid front that spreads through the pattern region and towards the boundary region. The boundary region extends from an outer boundary an imprint area of the template to an inner boundary. The inner boundary may be within a boundary width inwards from the outer boundary and towards the center of the template. The imprinting system may include an actinic illumination system. The actinic illumination system may be configured to during a first period of time, illuminate a first portion of the boundary region with a thickening dosage of light that is within a first dose range, such that the fluid in the first portion of the boundary region does not solidify but does increase viscosity of the fluid. The actinic illumination system may be configured to during a second period of time, illuminate the pattern region with a curing dosage of light that is within a second dose range higher than the first dose range, thus curing the fluid.

In an aspect of the first embodiment, the actinic illumination system may comprise: an actinic radiation source; a digital micromirror device; and an objective lens.

In an aspect of the first embodiment, the first dosage range is 1-3.5 millijoules per square centimeter ($mJ/cm^2$).

In an aspect of the first embodiment, the first period of time may begin after the fluid front enters the first portion of the boundary region. The first portion of the boundary region may include that portion of the boundary region in which the fluid front leaves the pattern region and enters the boundary region.

In an aspect of the first embodiment, the first portion of the boundary region may not include the corners of the boundary region and may include a portion of the edges of the boundary region.

In an aspect of the first embodiment, the first portion of the boundary region may include two opposing edges of the boundary region.

In an aspect of the first embodiment, the actinic illumination system may be further configured during a third period of time to illuminate a second portion of the boundary region with the thickening dosage of light. The second portion of the boundary region may include two opposing edges other than edges in the first portion of the boundary region.

In an aspect of the first embodiment, the template may be configured to imprint full fields and partial fields onto the substrate. The partial field may be an imprint field in which the template overhangs an edge of the substrate. The boundary region may include the intersection of the template and the edge of the substrate.

In an aspect of the first embodiment, there may be a third period of time after the first period of time and before the second period of time, wherein the actinic illumination system does not illuminate the boundary region or the pattern region during the third period of time.

In an aspect of the first embodiment, the viscosity of the fluid in the region of the advancing fluid front may be increased by a thickening multiple when exposed to the thickening dose.

In an aspect of the first embodiment, the thickening dose multiple may be between 1.1× and 100×.

In an aspect of the first embodiment, increasing the viscosity may reduce the velocity of the fluid front in the first portion of the boundary region whereby the fluid front does not extrude beyond the edge of the template before being cured during the second period of time.

In an aspect of the first embodiment, the first portion of the boundary region may sequentially extend from centers of the edge of the boundary region towards the corners of the boundary region.

In an aspect of the first embodiment, the first portion of the boundary region may be extended in 15×15 micrometers (μm) increments.

In an aspect of the first embodiment, the first portion of the boundary region may be extended to follow the fluid front as it enters the boundary region.

In an aspect of the first embodiment, areas of the edges of the first portion of the boundary region closest to the center of the edge may be sequentially removed from the first portion of the boundary region as areas of the boundary region are sequentially added to the first portion of the boundary region.

In an aspect of the first embodiment, during the first period of time the actinic illumination system may be further configured to illuminate the pattern region with a stray light dosage of light that is below the first dose range. The lower limit of the first dose range may be a dose that does not cause polymerization.

In an aspect of the first embodiment, during the second period of time the actinic illumination system may be further configured to illuminate both the boundary region and the pattern region with the curing dosage.

In an aspect of the first embodiment, the pattern region may include a plurality of recesses in the template and the boundary region does not include the plurality of recesses.

In an aspect of the first embodiment, the boundary width may be between 1 μm and 200 μm.

In an aspect of the first embodiment, the outer boundary may be at an edge of the imprint area of the template.

In an aspect of the first embodiment, the outer boundary may be near an edge of the imprint area of the template.

At least a second embodiment, may be a method of manufacturing an article on a substrate. The method may include dispensing a plurality of droplets onto the substrate. The method may include holding a template with a boundary region that surrounds and does not overlap a pattern region with a template chuck. The template chuck positions the template such that the template contacts the plurality of droplets such that the plurality of droplets merge and form a fluid front that spreads through the pattern region and towards the boundary region. The boundary region extends from an outer boundary of an imprint area of the template to an inner boundary. The inner boundary may be within a boundary width inwards from the outer boundary and towards the center of the template. The method may include actinic illuminating, during a first period of time, a first portion of the boundary region with a thickening dosage of light that is within a first dose range. The method may include illuminating, during a second period of time, the pattern region with a curing dosage of light that is within a second dose range higher than the first dose range.

At least a third embodiment, may be an imprinting method. The method may include dispensing a plurality of droplets onto a substrate. The method may include holding a template with a boundary region that surrounds and does not overlap a pattern region with a template chuck. The template chuck may position the template such that the template contacts the plurality of droplets such that the plurality of droplets merge and form a fluid front that spreads through the pattern region and towards the boundary region. The boundary region extends from an outer boundary imprint area of the template to an inner boundary. The inner boundary may be a with boundary width inwards from the outer boundary and towards the center of the template. The method may include, during a first period of time, illuminating a first portion of the boundary region within a thickening dosage of light that is within a first dose range. The method may include, during a second period of time, illuminating the pattern region with a curing dosage of light that is within a second dose range higher than the first dose range.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
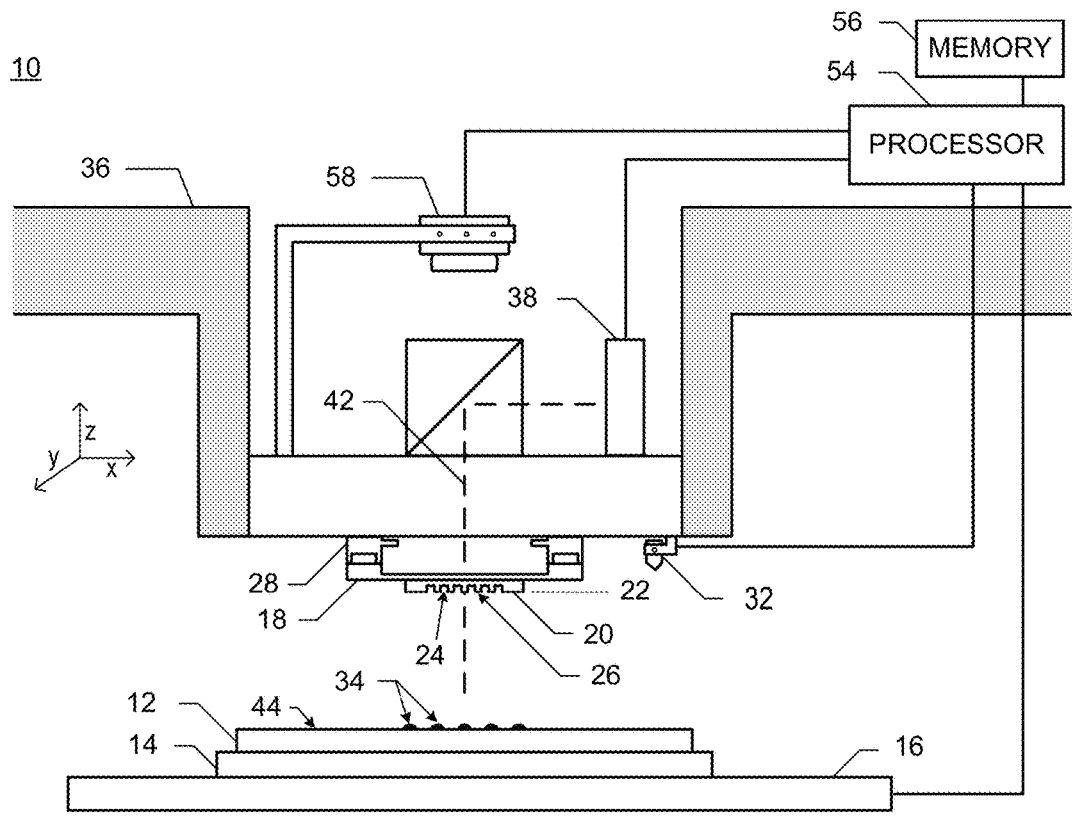
FIG. 1 is an illustration of a nanoimprint lithography system having a template and a mold spaced apart from a substrate.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed is a way to control extrusion during the imprint process while allowing gas to escape, and allowing alignment to occur while the template is being filled. Extrusion control during the imprint process helps with reduction in the number of defects. The applicants have determined that partially curing the imprint formable material near the mesa boundary during the formable material filling process can prevent the formation of extrusions. For example a boundary region near the edge of the mesa may be illuminated (e.g. with actinic radiation) while the rest of the imprint field is not substantially illuminated. When the liquid formable material reaches the mesa boundary it may be partially cured, or gelled to impede the further formable material propagation out of the mesa area and beyond the edges of the mesa boundary.

System

FIG. 1 is an illustration of a nanoimprint lithography system 10 in which an embodiment may be implemented. The nanoimprint lithography system 10 is used to form a relief pattern on a substrate 12. The substrate 12 may have a planar surface such as a semiconductor wafer. Substrate 12 may be coupled to a substrate chuck 14. Substrate chuck 14 may be but is not limited to a vacuum chuck, pin-type, groove-type, electrostatic, electromagnetic, and/or the like.

Substrate 12 and substrate chuck 14 may be further supported by a positioning stage 16. Stage 16 may provide translational and/or rotational motion along one or more of the x, y, z, θ, and φ-axes. Stage 16, substrate 12, and substrate chuck 14 may also be positioned on a base (not shown).

Spaced-apart from the substrate 12 is a template 18. Template 18 may be a body with one side having a mesa 20 extending therefrom towards the substrate 12. Mesa 20 may have a patterning surface 22 thereon. Further, mesa 20 may also be referred to as mold 20. Alternatively, template 18 may be formed without mesa 20.

Template 18 may be formed from such materials including, but is not limited to, fused-silica, quartz, silicon, organic polymers, siloxane polymers, borosilicate glass, fluorocarbon polymers, metal, hardened sapphire, and/or the like. The patterning surface 22 comprises features defined by a plurality of spaced-apart recesses 24 and/or protrusions 26, though embodiments of the present invention are not limited to such configurations (e.g., a planar surface). Patterning surface 22 may define any original pattern that forms the basis of a pattern to be formed on the substrate 12.

Template 18 may be coupled to a template chuck 28. Template chuck 28 may be, but is not limited to, vacuum, pin-type, groove-type, electrostatic, electromagnetic, and/or other similar chuck types. Further, template chuck 28 may be coupled to imprint head which in turn may be moveably coupled to a bridge 36 such that template chuck 28, imprint head, and template 18 are moveable in at least the z-axis direction, and potentially other directions.

Nanoimprint lithography system 10 may further comprise a fluid dispensing system 32. Fluid dispensing system 32 may be used to deposit formable material 34 (e.g. polymerizable material, resist, etc.) on substrate 12. For example, formable material 34 may comprise a monomer mixture as described in U.S. Pat. No. 7,157,036 and U.S. Pat. No. 8,076,386, both of which are herein incorporated by reference.

The nanoimprint lithography system 10 may further comprise an actinic source 38 that directs energy along path 42. One or more mirrors may be used to fold an irradiation optical axis along path 42. One or more of the template chuck 28, imprint head and stage 16 may be configured to position template 18 and substrate 12 in superimposition with path 42. Camera 58 may likewise be positioned in superimposition with at least a portion of path 42. One or more mirrors may be used to fold an imaging optical axis from the camera 58 to the template 18. Nanoimprint lithography system 10 may be regulated by processor 54 in communication with stage 16, imprint head, fluid dispensing system 32, actinic source 38, and/or camera 58 and may operate based on a computer readable program stored in a non-transitory computer readable memory 56.

Figure 2:
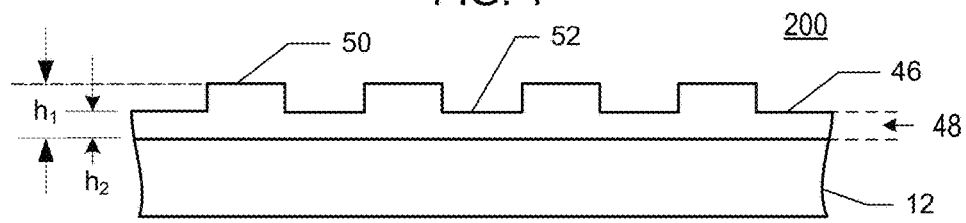
FIG. 2 is an illustration of a substrate with a solidified patterned layer formed upon it.

One or more of the template chuck 28, imprint head and stage 16 are configured to vary a distance between mold 20 and substrate 12 to define a desired volume that is filled by the formable material 34. For example, the template chuck 28 may apply a force to template 18 such that mold 20 contacts formable material 34. After the desired volume is filled with formable material 34, actinic source 38 produces energy (e.g., actinic radiation) causing formable material 34 to solidify and/or cross-link conforming to a shape of surface 44 of substrate 12 and patterning surface 22, defining patterned layer 46 (FIG. 2) on substrate 12. Patterned layer 46 may comprise a residual layer 48 and a plurality of features shown as protrusions 50 and recessions 52, with protrusions 50 having a height $h_1$ and residual layer having a height $h_2$ as illustrated in FIG. 2.

Figure 3:
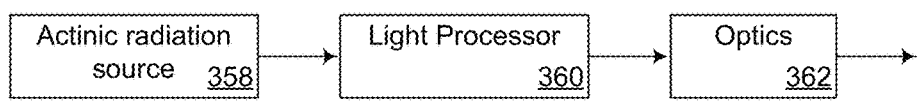
FIG. 3 is an illustration of actinic radiation source which might be used in an embodiment.

As illustrated in FIG. 3 the actinic source 38 may include an actinic radiation source 358 such as an UV LED, fluorescent lamp, gas-discharge laser, etc. Light from the actinic radiation source 358 may be sent to a light processor 360. The light processor 360 may be a digital mirror device (DMD), a liquid crystal on silicon (LcoS), a spatial light modulator (SLM), a liquid crystal device (LCD), one or more mechanical shutters, one or more reflectors, or any other device which can modulate the intensity of the light from the actinic radiation source 358 in both space and time in a controlled and variable manner. The light from the light processor 360 may be guided by optics 362 through the template and towards the formable material 34 on the substrate 12. In response to signal from the processor 54, the actinic source 38 may adjust the actinic radiation source 358 and/or the light processor 360.

The light processor 360 may be used to ensure that the actinic radiation only illuminates a boundary region by using one of a plurality of specific light patterns. The boundary region may be defined as a region substantially near the mesa boundary for full fields in the substrate 12. The boundary region may defined as the region near the intersection of the edge of the substrate 12 and the mesa boundaries which are in contact with the substrate 12 for partial fields on the edge of the substrate 12. Specific light patterns may be determined ahead of time or modified during the imprinting process if necessary. The boundary region may be defined as extending from an outer boundary of an imprint area of the template to an inner boundary. The outer boundary may be an edge of an imprint area of the template. Alternatively, the outer boundary may be near the edge of an imprint area of the template. In an embodiment, near the edge of an imprint area may be within less than 1 μm of the edge of an imprint area or within less than 1% of the total width of the imprint area to the edge imprint area. The outer boundary may be coincident with one or both of the mesa edge and the substrate edge. The inner boundary may be a boundary width inwards from the outer boundary and towards the center of the template. The boundary width may be between 1 μm and 200 μm. The boundary width may be determined by the velocity of the fluid front that is slowed down by gelling of the fluid at and/or near the fluid front.

Figure 4A:
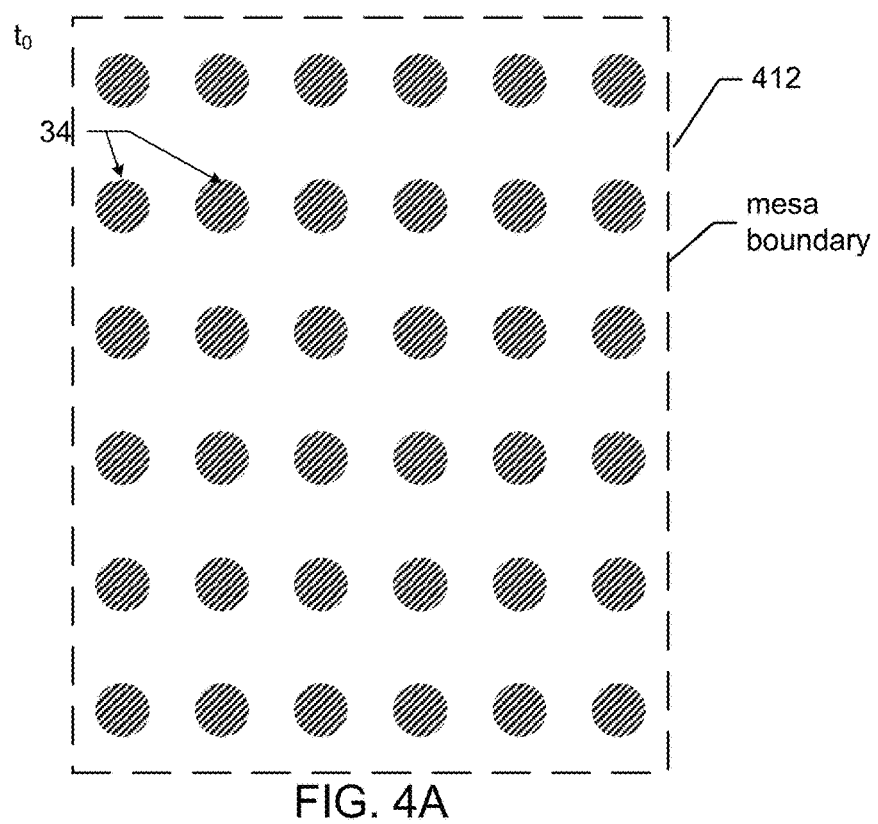
FIGS. 4A-F are illustrations of formable material between a template and a substrate.
Figure 4B:
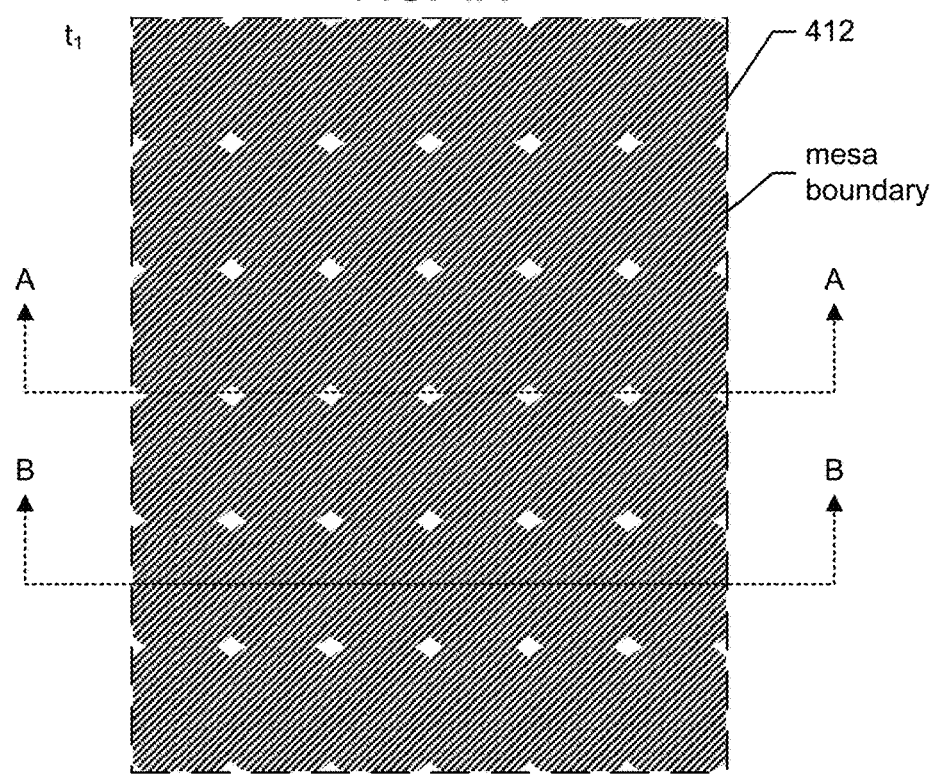

Nanoimprint system may make use of a template 18 with a defined mesa 20. The size and shape of a mesa 20 may be a rectangle with a size of 26 mm×33 mm such as the mesa 20 illustrated in FIG. 4A which is shown overlaying an array of droplets of formable material 34 on the substrate 12 at a time $t_0$. The mesa boundary 412 helps to limit the spreading of the formable material to only the imprint area covered by the mesa 20. Capillary forces help to limit the tendency of the formable material 34 from leaking out. FIG. 4B is an illustration of the formable material 34 at a later time $t_1$ in which the formable material has started but not finished spreading out. The formable material may spread due to the capillary force associated with being located in a narrow capillary slit.

Figure 4C:
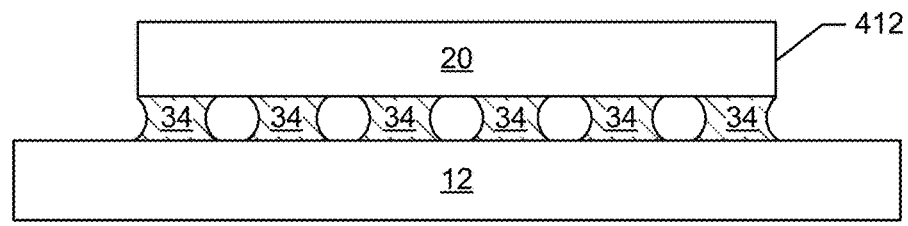
Figure 4D:
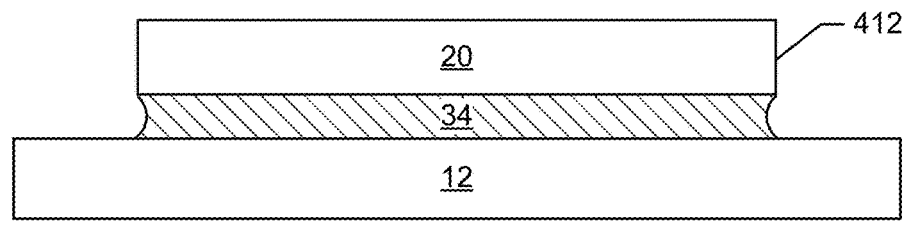

FIG. 4C is an illustration of a cross-section A-A (not to scale) as shown in FIG. 4B of the formable material 34 at time $t_1$. FIG. 4D is an illustration of a second cross-section B-B (not to scale) as shown in FIG. 4B of the formable material 34 at time $t_1$. FIGS. 4B-D illustrate the shape of the formable material 34 in which the mesa 20 is touching the droplets 34 and begins to spread. The droplets of formable material 34 spread due to the pressure being applied by the mesa 20 and/or due to the capillary force associated with being in a narrow capillary slit. In an alternative embodiment, the mesa 20 may be contacting the formable material but is not applying pressure and the droplets spread due solely to the capillary force. In one embodiment, the mesa 20 may apply uniform pressure (or capillary force) to all of the droplets at substantially the same time. In an alternative embodiment, the pressure (or capillary force) may be applied in a non-uniform manner. Please note, that a fluid front associated with some of the droplets may reach the mesa boundary before others droplets have completely spread out and filled in all of the gaps. This may be further complicated by non-uniform topography which can affect the rate at which gaps are filled.

Figure 4E:
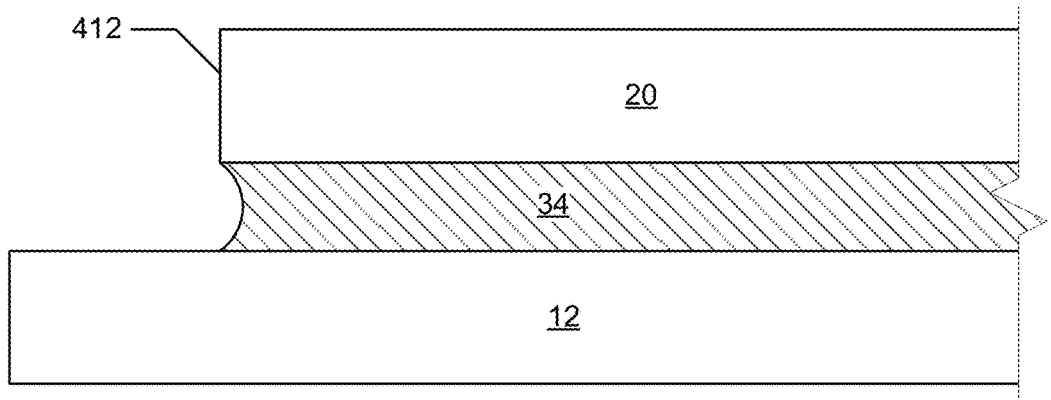

Due to wetting of both mesa 20 and substrate 12 the formable material forms a positive surface tension slope. A positive surface tension slope is formed when a liquid (i.e. the formable material 34) wets a surface (i.e. surface 44 of the substrate 12 and/or surface of mesa 20). The positive surface tension slope on both surfaces leads to effective drop spreading due to the capillary force. The template mesa edge 412 serves as a natural end of a capillary slit beyond which the formable material cannot spread (at least due to the capillary force). The capillary slit is formed between the template mesa surface and the substrate surface 44. FIG. 4E is an illustration of a zoomed in a portion of the formable material 34 near the mesa edge 412. FIG. 4E is an illustration of an ideal embodiment in which the formable material 34 does not spread beyond the mesa edge 412, in which the formable material 34 forms a meniscus that is pinned by the mesa edge 412. Moving the formable material further is energetically unfavorable as the capillary size becomes very large.

Figure 4F:
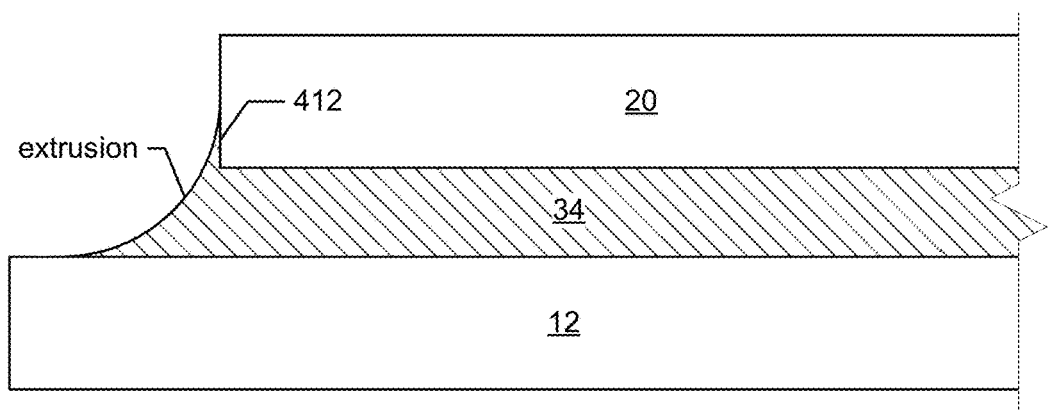

FIG. 4F is another illustration of the mesa edge region, in the case in which an extrusion is formed. After multiple impressions formable material sometimes accidently wets the side wall of the mesa and forms an extrusion. Extrusions are considered to be imprint defects. They can cause issues with subsequent imprinting, further process steps like planarization, etching, next layer deposition, etc. After a number of normal imprints with no extrusions the formable material 34 may form at some point an extrusion. This might happen due to excessive formable material volume near the boundary, formable material evaporation, and/or subsequent condensation on the mesa edge, etc.

Figure 5A:
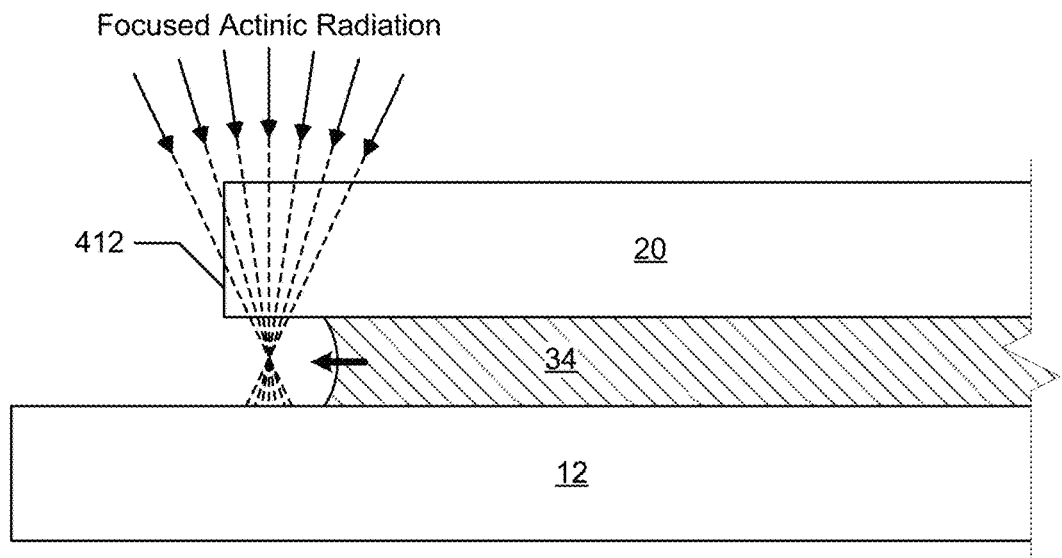
FIGS. 5A-C are illustrations of formable material between a template and a substrate in various steps in an embodiment.
Figure 5B:
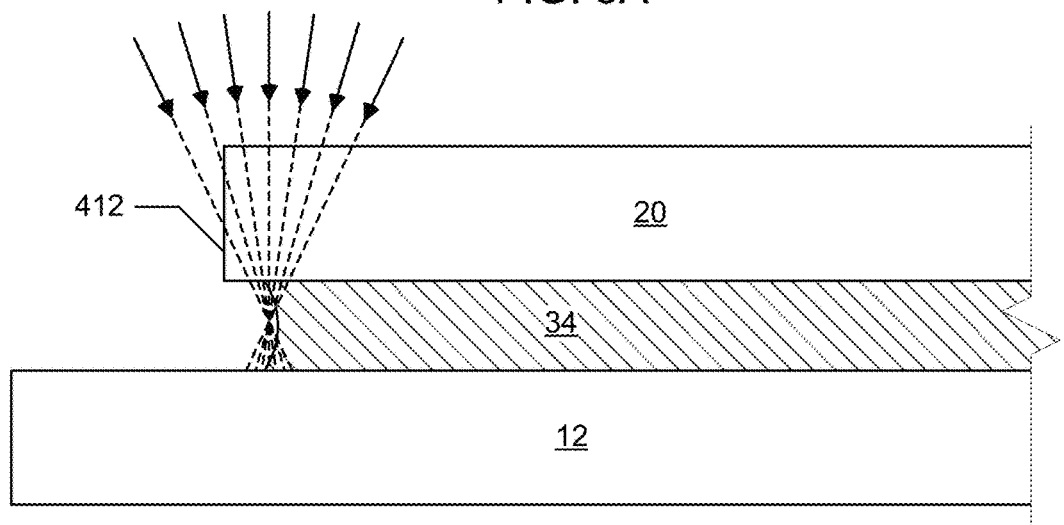
Figure 5C:
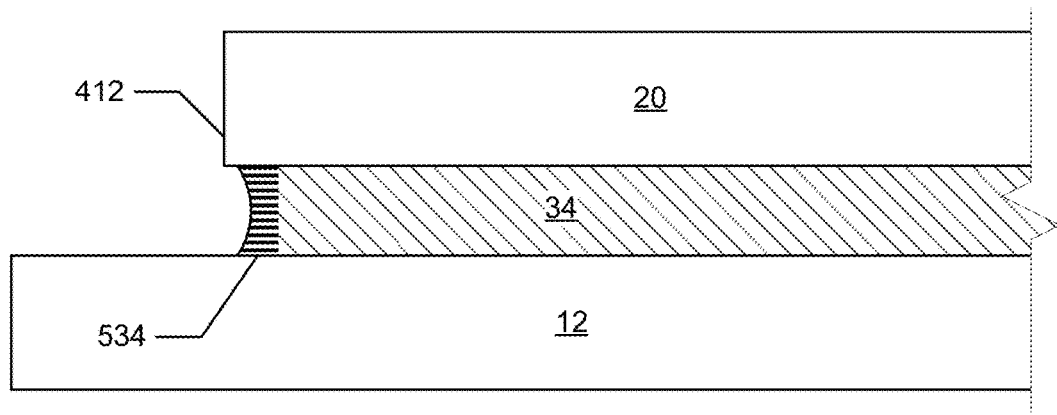

An embodiment may include an apparatus in which actinic radiation source 358 (e.g. UV light) is focused at the mesa boundary region so as to, in real-time, partially cure or gel the liquid formable material 34 as it reaches the mesa edge region as illustrated in FIG. 5A outside the patterned area. The actinic radiation source 358 may be focused on the mesa boundary region by a light processor 360. FIGS. 5A-C illustrate various steps in a process flow that may be practiced by an embodiment. FIG. 5A illustrates an initial stage of liquid formable material as initially applied to a substrate 12. The actinic radiation in the mesa boundary region may have a limited spot size for a limited time. An embodiment may also expose the area outside the mesa. A portion of an exposed region inside the mesa area may be adjusted by moving the focused beam in and out of the mesa area. Moving the focused beam can control the width of the affected formable material area. In an embodiment, actinic radiation is turned on just before the formable material reaches the boundary region.

FIG. 5B illustrates a moment $t_1$ when the formable material has spread into the actinic radiation exposed area. At this point in time when the actinic radiation and the formable material intersect a partial curing process or a gelling process can start. Depending on the intensity and exposure time, the formable material can be gelled to a different degree.

FIG. 5C illustrates a moment after the actinic radiation that illuminates the mesa boundary region is turned off. The formable edge material 534 at this point in time is a partially cured (gelled) or fully cured. In FIG. 5C this formable edge material 534 is illustrated with a different line pattern from the rest of the formable material 34. At this point in time the formable material 34 and the formable edge material 534 are cured to a different degree. The formable edge material 534 acts as barrier and substantially prevents the formable material which is still in a liquid state from spreading further beyond the mesa edge 412. Substantially in this context, means that a high percentage (70%, 80%, 90%, or 99% for example) of the formable edge material 534 does not leak out beyond the edges of the mesa. The formable edge material 534 that is partially cured will have a higher viscosity and lower mobility relative to the uncured formable material. In the context of the present disclosure partially cured also means gelled. The higher viscosity will slow the progress of the formable edge material towards the mesa boundary 412 allowing it to oppose capillary forces. In an embodiment, once the formable material is fully cured it is no longer mobile. In an embodiment, once the formable material has been fully cured, that means 80%-100% of the polymerizable material has polymerized. A next step after the formable material 34 has finished spreading may include exposing the whole imprint field to the actinic radiation. After all of the formable material has been exposed to actinic radiation and fully cured then the template separates.

Figure 6:
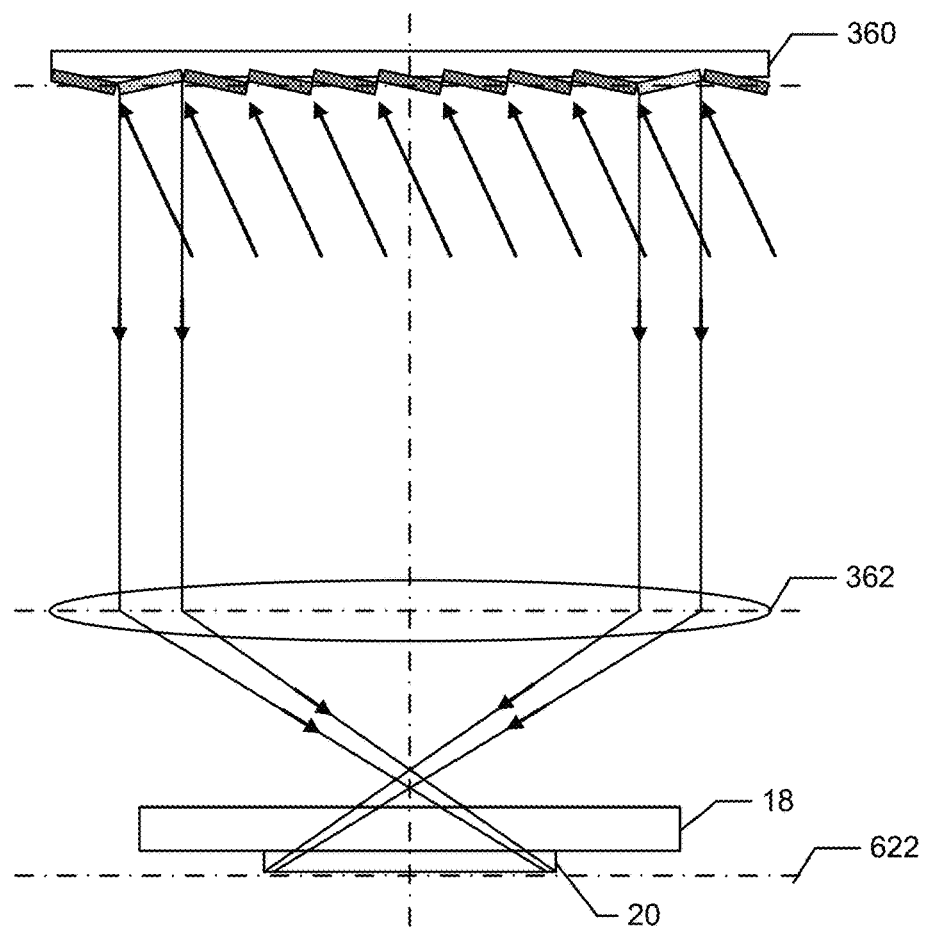
FIG. 6 is an illustration of a light processor as used in an embodiment

An embodiment may be configured to form an edge zone that takes the shape of a frame (hollow rectangle) near the mesa edge that is illuminated with actinic radiation. One method of illuminating just the edge zone is to use a light processor 360 such as a DMD device as illustrated in FIG. 6. The actinic radiation source 358 may illuminate a DLP mirror array (DMD) 360 which may reflect the light through an optical objective 362 that forms an image of the light processor onto an image plane that coincides with the imprint plane of the mesa 20. FIG. 6 is a schematic representation of the relative positions of the DMD 360, objective 362, template 18, and the mesa 20 (not to scale). When forming the frame, most of the mirrors of DMD are turned in such a way that the reflected actinic radiation is not collected by the objective lens. An aperture (not shown) may be used to prevent the unwanted radiation from reaching the substrate. Some of the mirrors of the DMD are oriented in such a way that actinic radiation is collected by the objective lens 362. The objective lens 362 (or other optical system) creates an image of the DLP mirrors in an image plane 622. The image plane coincides with the imprint plane 22, and/or the substrate surface 44, thus making the actinic radiation mirror image focused onto the imprint surface area. The actinic radiation source 358 may be non-collimated and may have a non-uniform radiation pattern, the resultant radiation pattern on the imprint may have a controlled illumination in the boundary area. The DLP mirrors may be made of aluminum. The aluminum mirrors may be coated with one or more films that increase the reflectivity of the mirrors for actinic radiation. The DLP mirrors may also be coated with a protective film like magnesium fluoride, or similar.

The optical system 362 may have magnification, demagnification, or zero magnification. In an embodiment, an image of the DMD 360 on the image plane 622 may be smaller than the original image formed in the DMD. This may allow better control of the spot size of the frame. For example, the size of each of the mirrors (pixel) in the DMD 360 (spatial light modulator) may be 30 µm×30 µm. The magnification of the optical system may be 1:2 (demagnification) producing an image that is 15 µm×15 µm. In an alternative embodiment, the optical system may have asymmetric magnification (and/or demagnification) in perpendicular directions so that a square DMD 360 can match a rectangular mesa 20. In an embodiment, the optical system may have a demagnification 1:6 and individual pixels as imaged onto the imprint plane may have a size of approximately 5 µm×5 µm.

Figure 7:
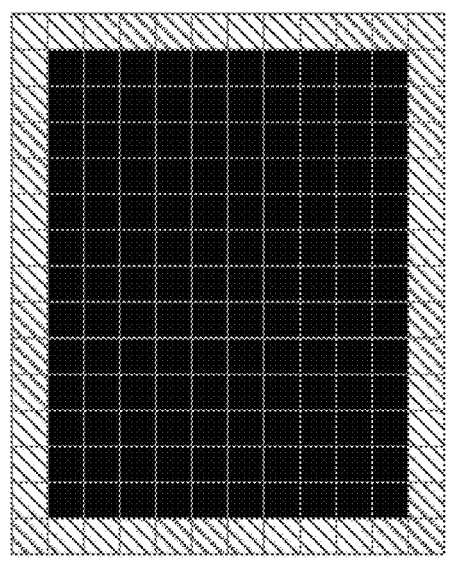
FIG. 7 is an illustration of a state of a light processor as used in an embodiment.

An embodiment may shift the focus of the DMD 360 so that the actinic radiation field between the mesa and the substrate is continuous. Spatial light modulators have gaps between individual pixels. For example DMDs have gaps between the individual mirrors. The fill factor of a spatial light modulators may be 92%, 90%, 80%, 50% etc. A slight defocusing can improve the performance by blurring out these gaps. This defocusing may be accomplished by shifting the focal plane 622 above or below the imprinting region. The imprinting region is a volume of space between the substrate 12 and the patterning surface FIG. 7 is an illustration of an "active" DLP mirror pixels (diagonal lines) and "inactive" mirror pixels (black) that form a "frame-like" rectangular shaped illumination field. The term "active" (or ON) in this context is a mirror that directs the actinic radiation in a direction that is gathered by the optical system 362 and passed on through the template 18. The term "inactive" (or OFF) in this context is a mirror that directs the actinic radiation in a direction that does not pass through the template 18.

Figure 8:
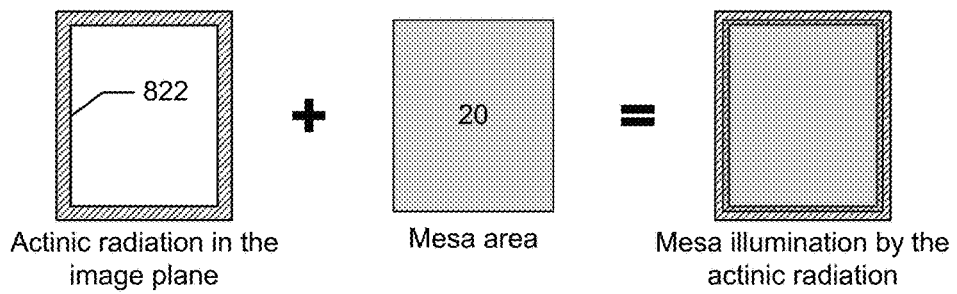
FIG. 8 is an illustration of a radiation pattern as used in an exemplary embodiment.

FIG. 8 is a schematic illustration of actinic radiation pattern 822 in the image plane. FIG. 8 also illustrates how actinic radiation pattern may overlap with the mesa 20. In an embodiment, the actinic radiation pattern 822 may extend beyond the mesa and at the same time include a boundary region.

The average incident angle of the actinic radiation may be chosen such that when it is reflected from an "active" DLP mirror it propagates along a main optical axis of the optical system and the template. An actinic radiation source 358 may be uncollimated. The optics 362 may compensate for this by positioning the light processor 360 relative to the image plane near the patterning surface 22. An embodiment may include a flat mirror or a curved mirror that may be used to direct light from an actinic radiation source 358 towards the light processor 360 at an incident angle that allows the light processor 360 to guide the light in the appropriate direction.

Figure 9:
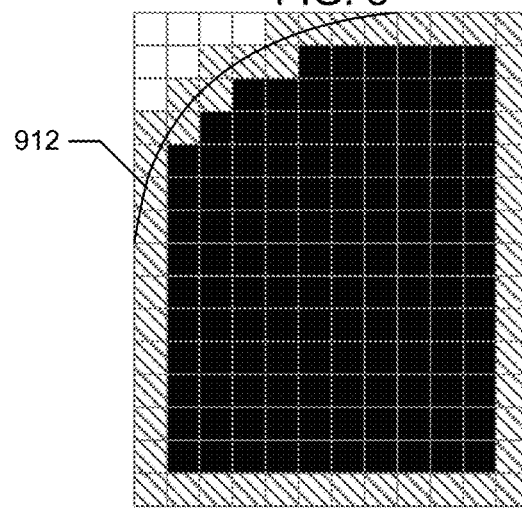
FIG. 9 is an illustration of a light processor state as may be used in an exemplary embodiment.

In an alternative embodiment, the actinic radiation may be used for partially curing the liquid formable material along an area other than a mesa boundary. For example, the light processor 360 may be configured to guide the actinic radiation to any arbitrary point of interest inside the imprint field. FIG. 9 is an illustration of an exemplary embodiment, in which a mesa is used to imprint a partial field that is bounded on one side by a curved boundary 912, which may be at or near an edge of the substrate 12. FIG. 9 illustrates how "active" mirror pixels may be changed to make a curved edge following the wafer edge shape in a partial shot.

FIGS. 14A-E are illustrations of patterns of illumination that may be used at various times by an embodiment. The grey dashed line shown in FIGS. 14A-E illustrates a simplified fluid front. The straight grey lines illustrate boundaries of pixels of a light processor 360 that have been imaged onto the substrate by optics 362. The pixels filled in with slanted lines represent illuminated pixels. The black pixels represent blocked pixels.

Figure 14A:
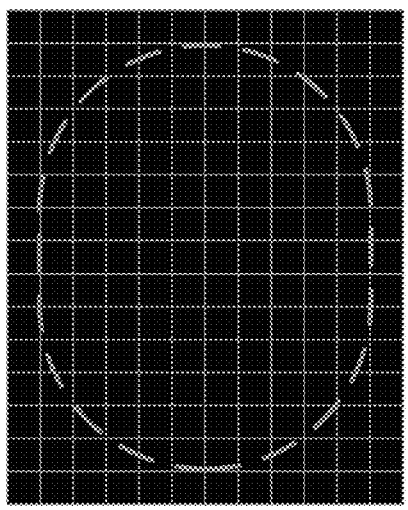
FIGS. 14A-F are illustrations of light processor sates as may be used in an exemplary embodiment.
Figure 14B:
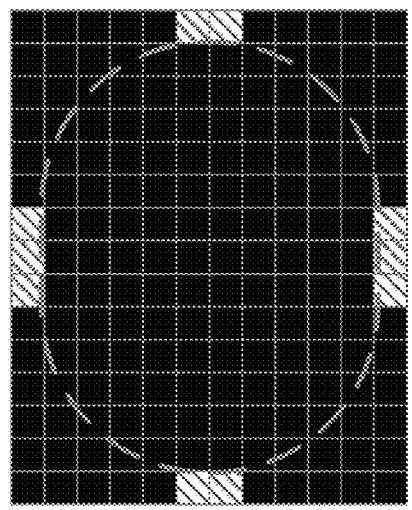
Figure 14C:
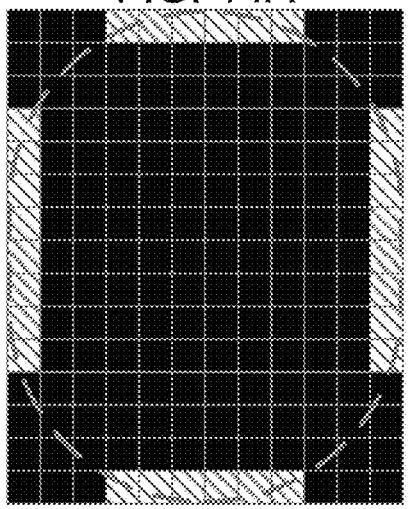
Figure 14D:
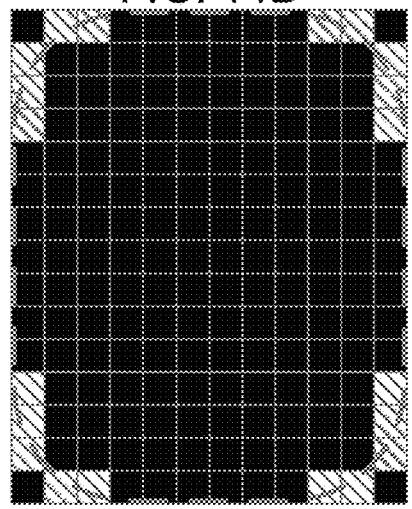
Figure 14E:
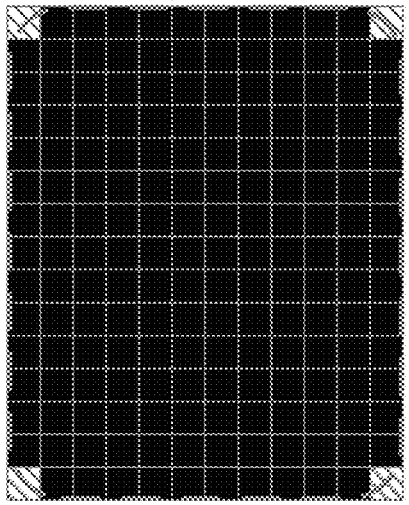
Figure 14F:
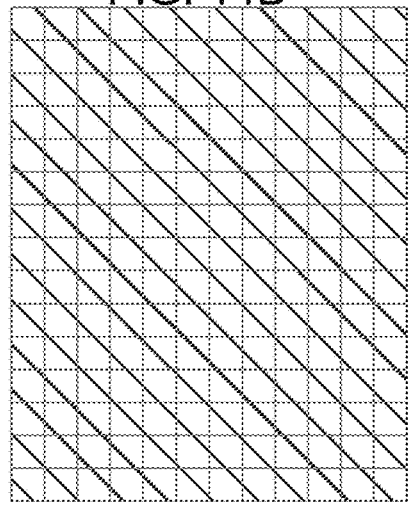

FIG. 14A illustrates a time in which the fluid front has yet to reach the boundary pixels, in which case none of the pixels are illuminated. FIG. 14B illustrates a time in which the fluid front has just started to reach the boundary region in which case only pixels in the centers of the edges of the boundary regions are illuminated. FIG. 14C illustrates a time in which the fluid front passes further into the boundary region in which case additional pixels along the boundary but not the corners are illuminated. FIG. 14D illustrates a time in which the fluid front reaches further into the boundary region but has not reached the corners of the boundary region, in which pixels at the center of the boundary region are not illuminated but pixels near the corners are illuminated. FIG. 14E illustrates a time in which the fluid front reaches the corners, in which case the pixels at the corners are illuminated. FIG. 14F illustrates a time in which the voids have left the pattern region and the alignment has finished at which time the pattern region is illuminated to cure the fluid. All of or portions of the boundary region may also be illuminated at this time.

Figure 10:
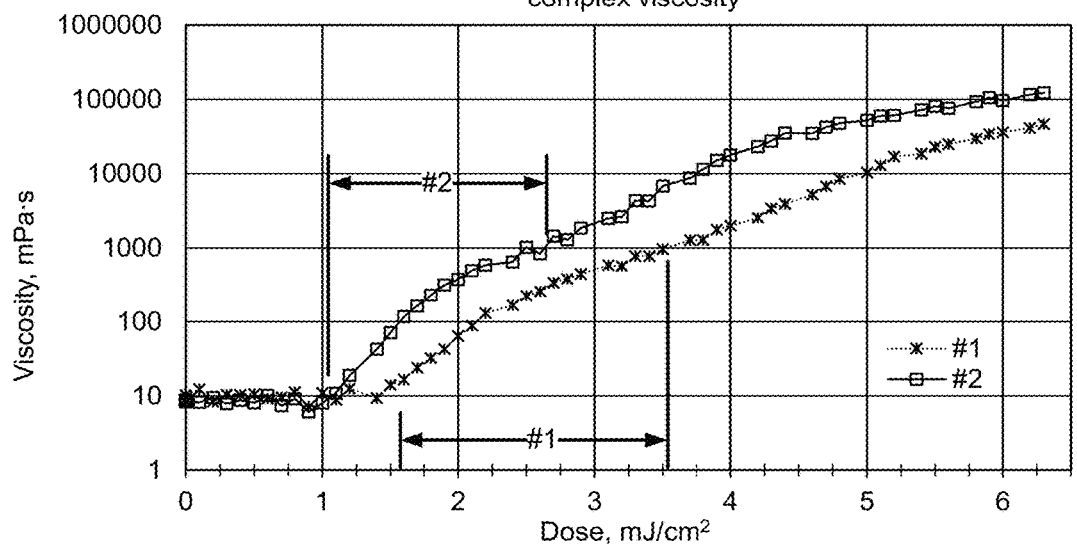
FIG. 10 is a chart illustrating viscosity data.

FIG. 10 is a chart illustrating viscosity data for two formable material formulations (#1 and #2) as a function of actinic radiation exposure dose. The applicant has determined that the appropriate actinic radiation dosage for these materials is indicated schematically by the corresponding ranges #1 and #2 as illustrated in FIG. 10. The original formable material viscosity for both materials is around 10 mPa·s prior to being exposed to actinic radiation. The applicant has determined that the ranges for appropriate actinic radiation dosage is one where the formable material viscosity changes from 1.1× or 10× to 100× of the original formable material viscosity (11 or 100 to 1000 mPa·s). The actinic radiation source may have a light intensity of 50 to 500 mW/cm$^2$. In order to produce an exposure dosage of 1.0 or 1.5-3.5 mJ/cm$^2$ which requires an exposure time in the range of ~2 or 3 msec to 70 msec. This exposure time provides a thickening dosage of actinic radiation which gels the formable material outside of the pattern region during a spreading phase but at the same time may not completely cure it. The thickening dosage is approximately 1% to 4% of the total actinic radiation dose required to completely cure the fluid. The thickening dosage is a dosage that falls within a first dose range. The lower limit of the first dose range is a dosage that is greater than an initiation dosage at which polymerization starts to occur, for example at approximately 1 mJ/cm$^2$. When the radiation is below the polymerization starting point other chemical reactions quench the polymerization reaction. The upper limit of the first dose range is a dose at which the fluid starts to turn into a solid, and interferes with alignment and the void elimination process. A second dose range is a curing dosage that is higher than first dose range and includes the total actinic radiation dose required to substantially solidify (cure) the fluid.

Table 1 below is an illustration of actinic radiation dose ranges and viscosity ranges that can be used in an exemplary embodiment for fluids #1 and #2. The thickening dosage is within the range in which a formable material becomes more viscous. The fluid can still move but the rate of spreading (velocity) significantly decreases.

TABLE 1

| Fluid | Thickening Dosage | Relative Viscosity increase | Viscosity range (mPa · s) |
| --- | --- | --- | --- |
| #1 | 1.4-3.5 mJ/cm$^2$ | 1.1x-100x | 11 to 1000 |
| #2 | 1-2.5 mJ/cm$^2$ | 1.1x-100x | 11 to 1000 |

The applicant has determined that the velocity at which the formable material spreads when it is sandwiched between a template 18 and a substrate 12 is approximately inversely proportional to the viscosity of the formable material. Thus increasing viscosity to a range of 1.1×, 1.5×, 2×, 5×, or 10× to 25×, 50× or 100× reduces a formable material flow rate (speed) and the flow rate down to 1% to 10% or 90% of the original values. For example, the viscosity may be increased, by approximately, 10%, 20%, 50%, 200%, 500%, 1000%, etc. The viscosity may by increase such that extrusions are substantially eliminated. This can reduce the formation of extrusions as not only the formable material flows slower but the amount of formable material that flows out of the capillary slit (space between mesa 20 and substrate 12) is significantly reduced thus not allowing accumulation of any significant volume of formable material at the mesa edge.

An embodiment may include a processor 54 that sends instructions stored in memory 56. The processor 54 may be configured to send signals to the light processor 360 based on these instructions. The light processor 360 in response to receiving signals from the processor 54, may be configured to expose actinic radiation in a boundary region in and around the template mesa edge boundary 412 or portion of the boundary region during a phase in which the liquid formable material was spreading while not expose a region of the template 18 that includes a pattern.

The light processor 360 may be configured to expose only areas where formable material gelling is desired. Formable material gelling may be desired in regions that approach the edge of the mesa edge boundary and substrate boundaries.

In an embodiment, only portions of the boundary region are exposed at the same time. The exposure may be applied only at the moment when at a specific boundary location the formable material reaches it. This means that corners of the boundary shown on FIG. 7 or FIG. 8 can be exposed later than the middle sections of the boundary.

In an embodiment, the formable material may be sensitive to one or more poisoning gases (i.e. oxygen) which prevent the formable material from curing or gelling. In an embodiment, the environment in which the imprinting is done does not include a poisoning gas and instead includes an imprinting gas (i.e. helium, nitrogen, etc.) which displaces the poisoning gas.

The nanoimprint lithography system 10 along with the Piezo fluid dispensing system 32 can be used to fabricate devices on a substrate such as: CMOS logic; microprocessors; NAND Flash memory; NOR Flash memory; DRAM memory; MRAM; 3D cross-point memory; Re-RAM; Fe-RAM; STT-RAM; optoelectronics and other devices in which nanoimprint lithography is used as part of the fabrication process.

Other substrates materials can but is not include but is not limited to: glass; fused silica; GaAs; GaN; InP; Sapphire, AlTiC; and other substrates well known in the art. Devices, fabricated on these substrates include patterned media, field effect transistor devices, heterostructure field effect transistors, light emitting diodes, read/write heads; and the like.

Second System

Figure 11:
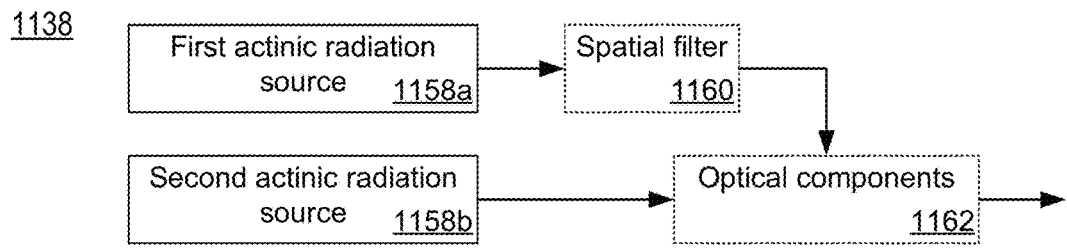
FIG. 11 is an illustration of actinic radiation source as may be used in an exemplary embodiment.

An alternative embodiment may be substantially similar to the first system and make use of an alternative source 1138 as illustrated in FIG. 11. The alternative source 1138 may include a first light source 1158a that provides actinic radiation in first dose range and a second light source 1158b that provides light in a second dose range.

The first light source 1158a may pass through an optional spatial filter 1160 which produces a first actinic radiation pattern. The first actinic radiation pattern may be a frame like pattern. The first actinic radiation pattern may only illuminate the boundary region including and near the mesa boundary 412 of the template 18 and does not illuminate the patterned region of the template 18. In an alternative embodiment, the first actinic radiation source 1158a is configured to produce the first actinic radiation pattern without passing through the spatial filter 1160. The first actinic radiation pattern may be produced by a plurality of light sources, each of which are positioned so that the combination of the plurality of light sources produces a frame-like shape. In an alternative embodiment, the first actinic radiation source 1158a may be have an annular output pattern which allows it to produce a shape that is frame like or can be optically manipulated to produce a frame like shape without the use of the spatial filter 1160. In an embodiment, the spatial filter 1160 is a static square or rectangular filter that substantially blocks or attenuates light from the first actinic radiation source 1158a which forms the inner boundary of the first actinic radiation pattern. The outer boundary of the first actinic radiation pattern may be unbounded and formed by the outer edge of the spot of light produced by the first actinic radiation source 1158a. The outer boundary of the first actinic radiation pattern may also be formed partially or completely by apertures of other components in the optical train between the first actinic radiation pattern and the template 18. In an alternative embodiment, the first actinic radiation pattern may change over time as it follows the fluid front through the boundary region.

The second actinic radiation source 1158b has a higher output power than the first actinic radiation source 1158a and provides enough power in the second dose range to cure the entire pattern region of the template 18 within a reasonable time (i.e. less than a second). The second actinic radiation 1158b may produce a second radiation pattern that may or may not overlap with the first radiation pattern.

The alternative source 1138 may also include one or more optical components 1162 which guide light from the first actinic radiation source 1158a (which may have passed through the spatial filter 1160) and the second radiation source 1158b and forms an image of the spatial filter in the imprint region between the substrate and the template. The one or more optical components 1162 include one or more of: lenses; mirrors; apertures; prisms; beam combiners; and/or shutters.

The alternative source 1138 may receive one or more low dose signals from the processor 54 that cause the first actinic radiation source 1158a to turn on and off at an appropriate time. An appropriate on time for the first actinic radiation source 1158a may be around the time that a fluid front reaches the boundary region. An appropriate off time ensures that the dosage provided by the first actinic radiation source 1158*a* is within the first dose range. In an alternative embodiment, the first actinic radiation source 1158*a* is kept on and a shutter placed somewhere between the first actinic radiation source 1158*a* and the template 18. The shutter may also be incorporated into the spatial filter 1160.

The alternative source 1138 may receive one or more high dose signals from the processor 54 that cause second actinic radiation source 1158*b* to turn on and off at appropriate times. An appropriate time for the second actinic radiation source 1158*b* to turn on may be around the time that the formable fluid is ready to be cured. An appropriate off time ensures that the dosage provided by the second actinic radiation source 1158*b* is within the second dose range. In an alternative embodiment, the second actinic radiation source 1158*b* is kept on and a high dose shutter (not shown) is placed somewhere between the second actinic radiation source 1158*b* and the template 18.

Third System

Figure 12:
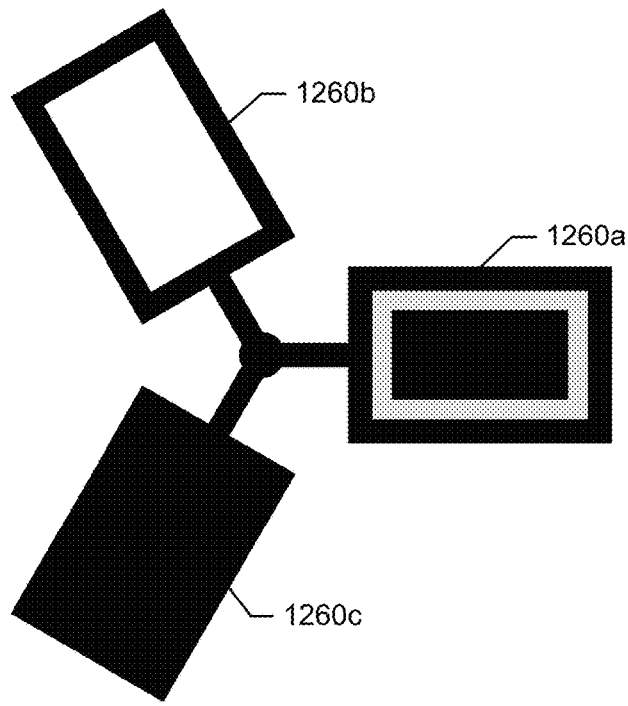
FIG. 12 is an illustration of a light processor as may be used in an exemplary embodiment.

A third system may be substantially similar to the first system. The third system may include a light processor 1260 which is a substantially mechanical system. For example the light processor may include a plurality of spatial filters that are moved between one or more actinic radiation sources 358 and the template 18. In an exemplary embodiment, the light processor 1260 includes a plurality of spatial filters that are mounted on a pinwheel as illustrated in FIG. 12. The filtering plane of the spatial filters may be in the plane of rotation of the pinwheel as illustrated in FIG. 12 or may be out of the plane of rotation of the pinwheel.

The plurality of spatial filters may include a first spatial filter 1260*a* that includes a rectangular frame that only allows actinic radiation that would form a frame like radiation pattern to pass through it. The first spatial 1260*a* filter may also attenuate the actinic radiation that passes through it. In an alternative embodiment, actinic radiation source may be focused in such a way that the intensity in the region which allows the actinic radiation to pass is less than an intensity in the middle thus lowering the intensity. Additional filters that are subsets of the first spatial filter 1260*a* may be used, allowing a radiation pattern to be formed that follows the fluid front.

The plurality of spatial filters may include a second spatial filter 1260*b* which allows actinic radiation to expose formable material under the mesa. In an alternative embodiment, the second spatial filter 1260*b* allows all the light produced by the actinic radiation source to pass through it.

The plurality of spatial filters may include a third spatial filter 1260*c* which blocks actinic radiation and keeps the actinic radiation from reaching the formable material under the mesa. In an alternative embodiment, instead of using the third spatial filter 1260*c* to block the actinic radiation, the actinic radiation source is turned off. The timing of the switching between filters is timed with switching the actinic radiation source on or off.

In response to signals from the processor 54 the light processor 1260 may switch between two or more of the spatial filters. Switching between spatial filters may include using a motor move the spatial filters into position to filter actinic radiation. The two or more spatial filters may be rotated or moved in a linear manner.

Fourth System

Figure 13:
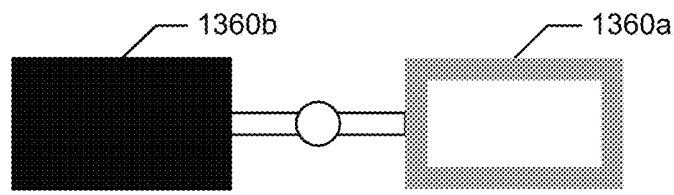
FIG. 13 is an illustration of a light processor as may be used in an exemplary embodiment.

A fourth system may be substantially similar to the third system in which a combination of absorptive material and/or reflective material are used as spatial filters. The fourth system may include a light processor 1360 which is a substantially mechanical system. For example the light processor 1360 may include a plurality of reflectors that are moved between one or more actinic radiation sources and the template 18. In an exemplary embodiment, the light processor 1360 includes as plurality of reflectors that are mounted on a pinwheel as illustrated in FIG. 13.

The plurality of spatial filters may include a first reflector 1360*a* that includes a rectangular frame-like reflector that directs actinic radiation to form a frame like radiation pattern in the region of the substrate 12 and patterning surface 22. The first reflector 1360*a* may also attenuate the actinic radiation. In an alternative embodiment, actinic radiation source may be focused in such a way that the intensity in the region which reflects the actinic radiation is less than an intensity in the middle thus lowering the intensity at the imprinting region.

The plurality of spatial filters may include a second reflector 1360*b* which directs the actinic radiation to expose formable material under the mesa. In an alternative embodiment, the second reflector 1360*b* allows all the light produced by the actinic radiation source to be reflected.

In response to signals from the processor 54, the light processor 1360 may switch between two or more of the reflectors. The light processor 1360 may also move all of the reflectors out of the way to prevent actinic radiation from reaching the template 18. Switching between reflectors may include using a motor to move the reflectors into position to direct the actinic radiation. The two or more reflectors may be rotated or moved in a linear manner.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An imprinting system comprising:
   a formable material dispensing system configured to dispense a fluid as a plurality of droplets onto a substrate;
   a template chuck configured to hold a template with a boundary region that surrounds and does not overlap a pattern region, wherein the template chuck is configured to position the template such that the template contacts the plurality of droplets such that the plurality of droplets merge and form a fluid front that spreads through the pattern region and towards the boundary region, wherein the boundary region extends from an outer boundary of an imprint area of the template to an inner boundary, the inner boundary is within a boundary width inwards from the outer boundary and towards the center of the template;
   an actinic illumination system that is configured to:
      during a first period of time, illuminate a first portion of the boundary region with a thickening dosage of light that is within a first dose range, such that the fluid in the first portion of the boundary region does not solidify but does increase a viscosity of the fluid; and
      during a second period of time, illuminate the pattern region with a curing dosage of light that is within a second dose range higher than the first dose range;
   wherein the first dose range is 1-3.5 millijoules per square centimerter ($mJ/cm^2$);

wherein the viscosity of fluid in the region of the advancing fluid front is increased by a thickening multiple when exposed to the thickening dose; and wherein increasing the viscosity reduces the velocity of the fluid front in the first portion of the boundary region whereby the fluid front does not extrude beyond the edge of the template before being cured during the second period of time.

2. The imprinting system according to claim 1, wherein the actinic illumination system comprises:
an actinic radiation source;
a digital micromirror device; and
an objective lens.

3. The imprinting system according to claim 1, wherein:
the first period of time begins after the fluid front enters the first portion of the boundary region; and
the first portion of the boundary region includes that portion of the boundary region in which the fluid front leaves the pattern region and enters the boundary region.

4. The imprinting system according to claim 1, wherein the first portion of the boundary region does not include the corners of the boundary region and does include a portion of the edges of the boundary region.

5. The imprinting system according to claim 4, wherein the first portion of the boundary region includes two opposing edges of the boundary region.

6. The imprinting system according to claim 5, wherein the actinic illumination system is further configured during a third period of time to illuminate a second portion of the boundary region with the thickening dosage of light, wherein the second portion of the boundary region includes two opposing edges other than edges in the first portion of the boundary region.

7. The imprinting system according to claim 1, wherein:
the template chuck is configured to imprint full fields and partial fields onto the substrate with the template;
the partial field is an imprint field in which the template overhangs an edge of the substrate;
the boundary region includes the intersection of the template and the edge of the substrate.

8. The imprinting system according to claim 1, wherein the thickening multiple is between 1.1× and 100×.

9. The imprinting system according to claim 1, wherein the first portion of the boundary region sequentially extends from centers of the edge of the boundary region towards the corners of the boundary region.

10. The imprinting system according to claim 9, wherein the first portion of the boundary region is extended in 15×15 micrometers (μm) increments.

11. The imprinting system according to claim 9, wherein the first portion of the boundary region is extended to follow the fluid front as it enters the boundary region.

12. The imprinting system according to claim 9, wherein areas of the edges of the first portion of the boundary region closest to the center of the edge are sequentially removed from the first portion of the boundary region as areas of the boundary region are sequentially added to the first portion of the boundary region.

13. The imprinting system according to claim 1, wherein during the first period of time the actinic illumination system is further configured to illuminate the pattern region with a stray light dosage of light that is below the first dose range.

14. The imprinting system according to claim 1, wherein during the second period of time the actinic illumination system is further configured to illuminate both the boundary region and the pattern region with the curing dosage.

15. The imprinting system according to claim 1, wherein the pattern region includes a plurality of recesses in the template and the boundary region does not include the plurality of recesses.

16. The imprinting system according to claim 1, wherein the boundary width is between 1 μm and 200 μm.

17. The imprinting system according to claim 1, wherein the outer boundary is at an edge of the imprint area of the template.

18. The imprinting system according to claim 1, wherein the outer boundary is near an edge of the imprint area of the template.

19. An imprinting system comprising:
a formable material dispensing system configured to dispense a fluid as a plurality of droplets onto a substrate;
a template chuck configured to hold a template with a boundary region that surrounds and does not overlap a pattern region, wherein the template chuck is configured to position the template such that the template contacts the plurality of droplets such that the plurality of droplets merge and form a fluid front that spreads through the pattern region and towards the boundary region, wherein the boundary region extends from an outer boundary of an imprint area of the template to an inner boundary, the inner boundary is within a boundary width inwards from the outer boundary and towards the center of the template;
an actinic illumination system that is configured to:
during a first period of time, illuminate a first portion of the boundary region with a thickening dosage of light that is within a first dosage range, such that the fluid in the first portion of the boundary region does not solidify but does increase a viscosity of the fluid; and
during a second period of time, illuminate the pattern region with a curing dosage of light that is within a second dose range higher than the first dosage range;
wherein the first dosage range is 1-3.5 millijoules per square centimeter ($mJ/cm^2$).

20. An imprinting system comprising:
a formable material dispensing system configured to dispense a fluid as a plurality of droplets onto a substrate;
a template chuck configured to hold a template with a boundary region that surrounds and does not overlap a pattern region, wherein the template chuck is configured to position the template such that the template contacts the plurality of droplets such that the plurality of droplets merge and form a fluid front that spreads through the pattern region and towards the boundary region, wherein the boundary region extends from an outer boundary of an imprint area of the template to an inner boundary, the inner boundary is within a boundary width inwards from the outer boundary and towards the center of the template;
an actinic illumination system that is configured to:
during a first period of time, illuminate a first portion of the boundary region with a thickening dosage of light that is within a first dose range, such that the fluid in the first portion of the boundary region does not solidify but does increase a viscosity of the fluid; and
during a second period of time, illuminate the pattern region with a curing dosage of light that is within a second dose range higher than the first dose range;

wherein the first dose range is 1-3.15 millijoules per square centimeter (mJ/cm$^2$); and wherein there is a third period of time after the first period of time and before the second period of time, wherein the actinic illumination system does not illuminate the boundary region or the pattern region during the third period of time.

21. A method of manufacturing an article on a substrate comprising:

dispensing a plurality of droplets onto the substrate;

holding a template with a boundary region that surrounds and does not overlap a pattern region with a template chuck, wherein the template chuck positions the template such that the template contacts the plurality of droplets such that the plurality of droplets merge and form a fluid front that spreads through the pattern region and towards the boundary region, wherein the boundary region extends from an outer boundary of an imprint area of the template to an inner boundary, the inner boundary is within a boundary width inwards from the outer boundary and towards the center of the template;

during a first period of time, illuminating a first portion of the boundary region with a thickening dosage of light that is within a first dose range;

during a second period of time, illuminating the pattern region with a curing dosage of light that is within a second dose range higher than the first dose range;

wherein the first dose range is 1-3.5 millijoules per square centimeter (mJ/cm$^2$);

wherein the viscosity of fluid in the region of the advancing fluid front is increased by a thickening multiple when exposed to the thickening dose; and wherein increasing the viscosity reduces the velocity of the fluid front in the first portion of the boundary region whereby the fluid front does not extrude beyond the edge of the template before being cured during the second period of time.

22. An imprinting method comprising:

dispensing a plurality of droplets onto a substrate;

holding a template with a boundary region that surrounds and does not overlap a pattern region with a template chuck, wherein the template chuck positions the template such that the template contacts the plurality of droplets such that the plurality of droplets merge and form a fluid front that spreads through the pattern region and towards the boundary region, wherein the boundary region extends from an outer boundary of an imprint area of the template to an inner boundary, the inner boundary is within a boundary width inwards from the outer boundary and towards the center of the template;

during a first period of time, illuminating a first portion of the boundary region with a thickening dosage of light that is within a first dose range;

during a second period of time, illuminating the pattern region with a curing dosage of light that is within a second dose range higher than the first dose range;

wherein the first dose range is 1-3.5 millijoules per square centimeter (mJ/cm$^2$);

wherein the viscosity of fluid in the region of the advancing fluid front is increased by a thickening multiple when exposed to the thickening dose; and wherein increasing the viscosity reduces the velocity of the fluid front in the first portion of the boundary region whereby the fluid front does not extrude beyond the edge of the template before being cured during the second period of time.

23. An imprinting system comprising:

a formable material dispensing system configured to dispense a fluid as a plurality of droplets onto a substrate;

a template chuck configured to hold a template with a boundary region that surrounds and does not overlap a pattern region, wherein the template chuck is configured to position the template such that the template contacts the plurality of droplets such that the plurality of droplets merge and form a fluid front that spreads through the pattern region and towards the boundary region, wherein the boundary region extends from an outer boundary of an imprint area of the template to an inner boundary, the inner boundary is within a boundary width inwards from the outer boundary and towards the center of the template;

an actinic illumination system that is configured to:

during a first period of time, illuminate a first portion of the boundary region with a thickening dosage of light that is within a first dose range, such that the fluid in the first portion of the boundary region does not solidify but does increase a viscosity of the fluid;

wherein the first dose range is 1-3.5 millijoules per square centimeter (mJ/cm$^2$);

during a second period of time, illuminate the pattern region with a curing dosage of light that is within a second dose range higher than the first dose range;

during a third period of time after the first period of time and before the second period of time, illuminate a second portion of the boundary region with the thickening dosage of light that is within the first dose range, such that the fluid in the second portion of the boundary region does not solidify but does increase the viscosity of the fluid, wherein the second portion of the boundary region is between corner portions of the boundary region and the first portion of the boundary region; and during a fourth period of time after the third period of time and before the second period of time, illuminate the corner portions of the boundary region with the thickening dosage of light that is within the first dose range, such that the fluid in the corner portions of the boundary region does not solidify but does increase the viscosity of the fluid.

* * * * *